United States Patent
Tanaka

(10) Patent No.: US 7,352,254 B2
(45) Date of Patent: Apr. 1, 2008

(54) MICRO-OSCILLATOR, SEMICONDUCTOR DEVICE AND COMMUNICATION APPARATUS

(75) Inventor: Masahiro Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 115 days.

(21) Appl. No.: 11/344,373

(22) Filed: Jan. 30, 2006

(65) Prior Publication Data

US 2006/0170508 A1 Aug. 3, 2006

(30) Foreign Application Priority Data

Feb. 1, 2005 (JP) .................... P2005-025529

(51) Int. Cl.
  *G04C 3/10* (2006.01)
  *H03B 5/30* (2006.01)
  *H02N 2/00* (2006.01)
(52) U.S. Cl. ............... 331/116 M; 331/154; 333/186; 333/197; 310/309
(58) Field of Classification Search ........... 331/116 R, 331/116 M, 154, 156; 333/186, 197, 200; 310/321, 328, 311
See application file for complete search history.

(56) References Cited

U.S. PATENT DOCUMENTS

| 4,137,511 A | * | 1/1979 | Jones | 333/186 |
| 6,713,938 B2 | * | 3/2004 | Nguyen | 310/309 |
| 2005/0140467 A1 | * | 6/2005 | Duwel et al. | 333/189 |
| 2007/0052497 A1 | * | 3/2007 | Tada | 333/186 |

OTHER PUBLICATIONS

Clark T.-C. Nguyen, "Frequency-Selective MEMS for Miniaturized Low-Power Communications Devices", IEEE Transactions of Microwave Theory and Techniques, vol. 47, No. 8, Aug. 1999, pp. 1486-1503.*

Frank D. Bannon III et al. "High-Q HF Microelectromechanical Filters", IEEE Journal of Solid-state Circuits, vol. 35, No. 4, Apr. 2000, pp. 512-526.

* cited by examiner

*Primary Examiner*—Robert Pascal
*Assistant Examiner*—Ryan J Johnson
(74) *Attorney, Agent, or Firm*—Bell, Boyd & Lloyd LLP

(57) ABSTRACT

A micro-oscillator is provided. In an example, the micro-oscillator applied to a signal filter and the like, ground capacitance thereof is reduced to control the loss of signal output. An oscillator element having a beam facing lower electrodes and to be electrostatically driven is formed on a substrate, and a wire width W1 of a DC bias feeder wire connected to the beam is formed to be narrower than a width of the beam.

10 Claims, 11 Drawing Sheets

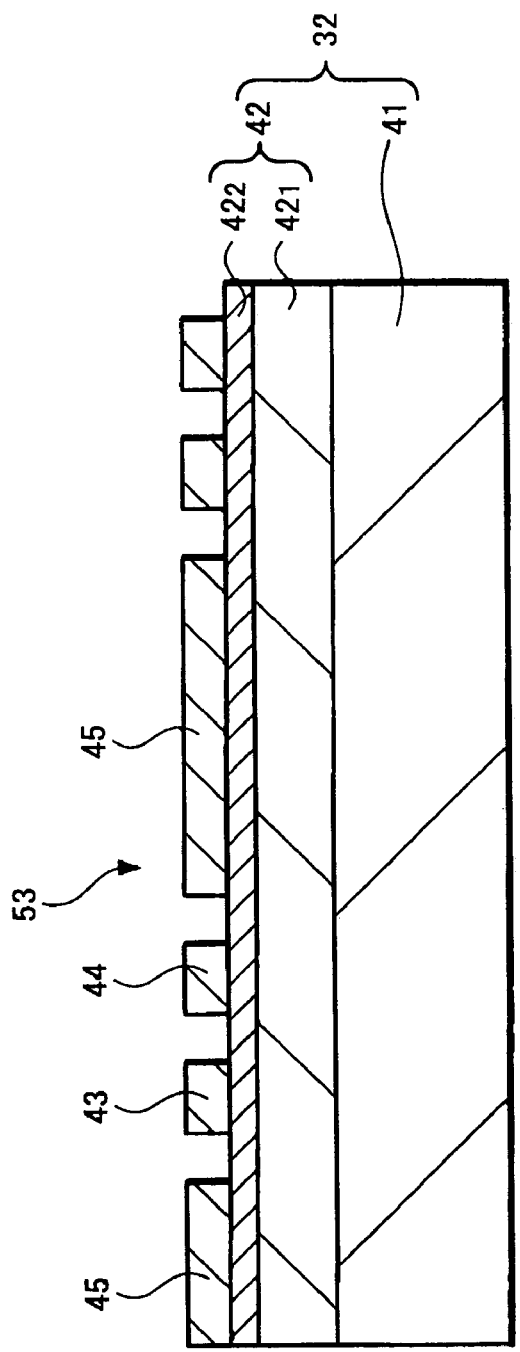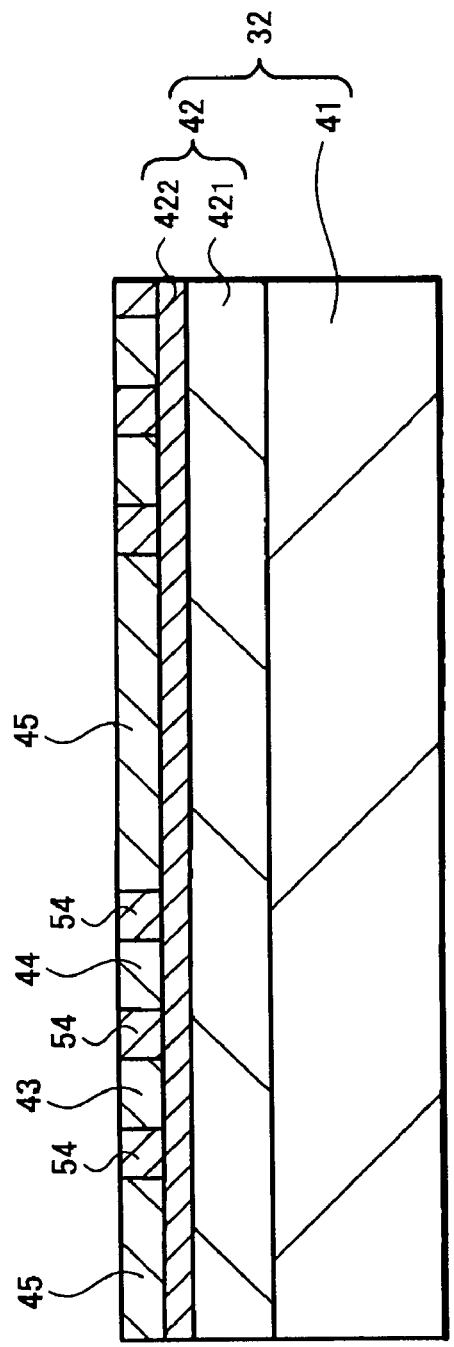

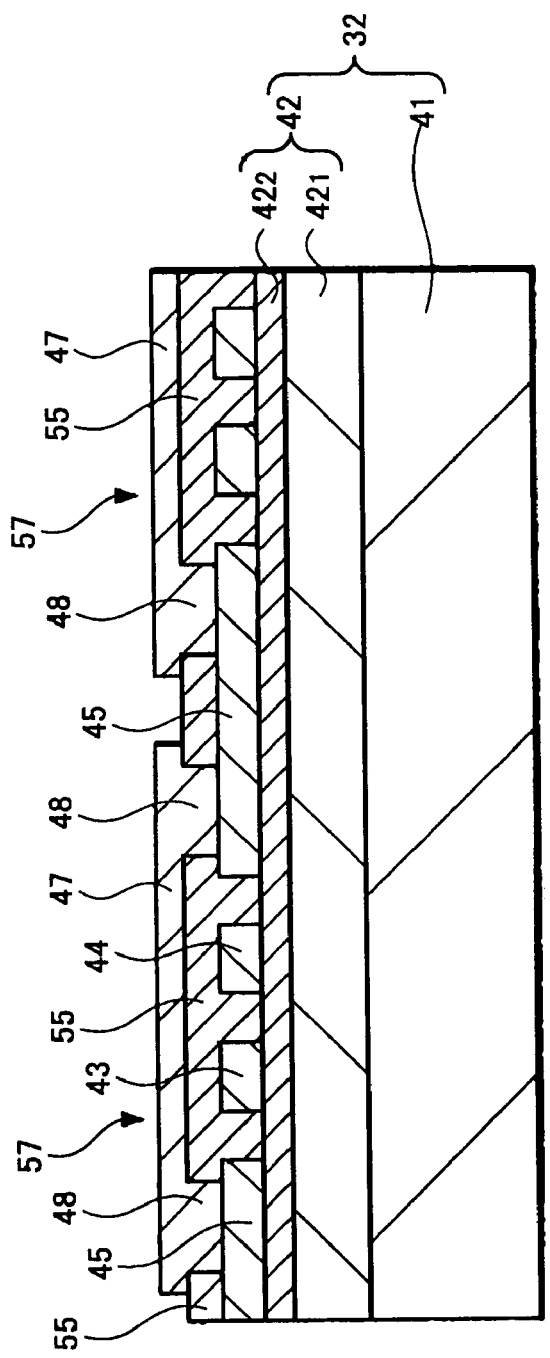
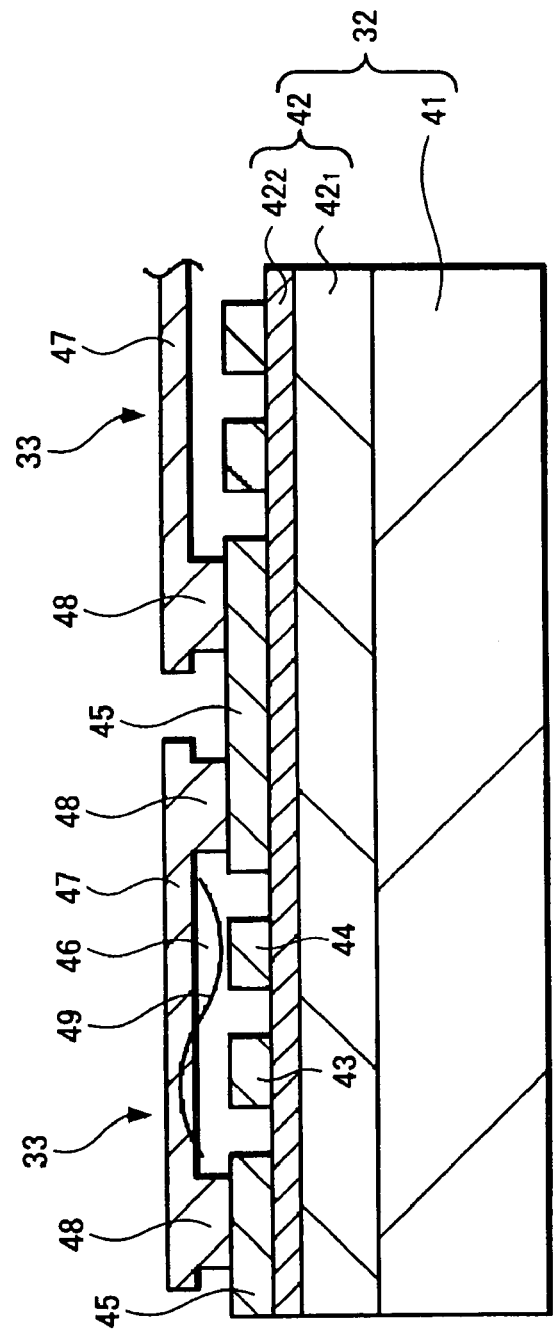
FIG. 8A
FIG. 8B

MICRO-OSCILLATOR, SEMICONDUCTOR DEVICE AND COMMUNICATION APPARATUS

CROSS REFERENCES TO RELATED APPLICATIONS

The present application claims priority to Japanese Patent Application JP 2005-025529 filed in the Japanese Patent Office on Feb. 1, 2005, the entire contents of which being incorporated herein by reference.

BACKGROUND

The present application relates to a micro-oscillator to be an element of devices such as a signal filter, mixer and resonator, a semiconductor device including the micro-oscillator and a communication apparatus that uses a band filter including the micro-oscillator.

A micro-oscillator produced by using micro-machine (MEMS: Micro Electro Mechanical Systems) technology is widely known. A use of this micro-oscillator as a high frequency filter has been proposed by research institutes including Michigan University (see, C.T.-Nguyen, Micromechanical components for miniaturized low-power communications (invited plenary), proceedings, 1999 IEEE MTT-S International Microwave Symposium RF MEMS Workshop, Jun. 18, 1999, pp 48-77).

FIG. 1 schematically shows a micro-oscillator constituting the above-described high frequency filter, that is, a beam-type oscillator with electrostatic drive. The oscillator 1 includes: an input-side wiring layer 4 and an output electrode 5 which are made of polycrystalline silicon, for example, and are formed on a semiconductor substrate 2 through an insulation film 3 and an electrode to be an oscillation plate, what is called a beam 7, formed to face this output electrode 5 across a space 6 to be an oscillating plate. The beam 7 is connected to the input-side wiring layer 4 by straddling like a bridge to be supported by anchor portions (support portions) 8 [8A, 8B] at both ends. The beam 7 functions as an input electrode. An input terminal t1 is led out from the input-side wiring layer 4 and an output terminal t2 is led out from the output electrode 5, respectively. In this oscillator 1, a high frequency signal Si is supplied to the beam 7 through the input terminal t1 in a state where a direct current bias (hereinafter, referred to as a DC bias) voltage V1 is applied between the beam and the ground. Specifically, when the DC bias voltage V1 and high frequency signal S1 are overlapped and supplied from the input terminal t1, the beam 7 having a natural oscillation frequency determined by the length, oscillates by an electrostatic force generated between the output electrode 5 and the beam 7. With this oscillation, a high frequency signal corresponding to a temporal change of capacitance between the output electrode 5 and the beam 7 and the DC bias voltage is output from the output electrode 5 (hence, from the output terminal t2). A signal corresponding to the natural oscillation frequency (characteristic frequency) of the beam 7 is output in the high frequency filter.

On the other hand, there has been no verification in which the structure of a DC power feeder line from an oscillator is studied from the standpoint of securing a signal strength when signal processing is performed, in the case where one or a number of oscillators are disposed on a semiconductor substrate or on a substrate such as an insulating substrate to perform signal processing.

FIG. 2 shows another structure of the above described electrostatic drive micro-oscillator as related art. The micro-oscillator 11 includes: an input electrode 14 and an output electrode 15 formed on a polycrystalline semiconductor substrate 12 through an insulation film 13 and an electrode to be an oscillating plate, that is, a beam 17 formed to face those input electrode 14 and output electrode 15 across a space 16. The beam 17 straddles the input electrode 14 and output electrode 15 like a bridge and is integrally supported by anchor portions (support portions) 19 [19A, 19B] at both ends to be connected to a wiring layer 18 disposed outside the input and output electrodes 14 and 15. An input terminal t1 is led out from the input electrode 14 and an output terminal t2 is led out from the output electrode 15. A required DC bias voltage V1 is applied to the beam 17.

In this micro-oscillator 11, when a high frequency signal S1 is input into the input electrode 14, the beam 17 resonates by electrostatic power generated between the beam 17 to which the DC bias voltage V1 is applied and the input electrode 14, and a high frequency signal of an objective frequency is output from the output electrode 15. According to the micro-oscillator 11, since the facing area of the input and output electrodes 14 and 15 can be small and an interval between the input and output electrodes 14 and 15 can be large, parasitic capacitance C11 between the input and output electrodes becomes small in comparison to the oscillator 1 of FIG. 1. Therefore, a signal directly transmitted through the parasitic capacitance C11 between the input and output electrodes 14 and 15, in other words, a noise component becomes small and an S/N ratio of an output signal can be improved.

On the other hand, as shown in FIG. 3, there has also been proposed the one in which a plurality of oscillators (hereinafter, referred to as oscillator elements), for example, oscillator elements 21 [21A, 21B, 21C] including input and output electrodes 14, 15 of lower electrodes and a beam 17 are provided on the same substrate as an oscillator group such that the input and output electrodes 14 and 15 are connected in parallel to be shared in common, and so combined impedance of the entirety decreases to be applied to a high frequency device.

Here, as described above, the electrostatic drive oscillator includes a beam capable of oscillating and an electrode, and the beam is electrically oscillated by the electrode disposed apart. The oscillation is excited in the vertical direction with respect to the substrate. In order to extract an electrical resonance signal from a mechanical resonance of the beam, DC bias voltage is required to be applied between the beam and the electrode. As a matter of course, the beam needs wiring, that is, a DC bias feeder wire to apply the DC bias voltage.

Further, as explained in FIG. 3, in order to reduce the impedance of the electrostatic drive resonator, oscillator elements have been provided in parallel. This is because it is more convenient from a manufacturing perspective to dispose in parallel a large number of oscillators of suitable size rather than to dispose one huge oscillator. The DC bias feeder wire between the oscillator elements becomes necessary when the oscillators provided in parallel.

However, although the impedance decreases when oscillator elements are provided in parallel, an area where the whole oscillator system is installed, specifically, the ground capacitance increases at the same time. With the leakage of a signal to the substrate side through ground floating capacitance connected to the path of the signal, loss of an output signal is caused.

Additional features and advantages are described herein, and will be apparent from, the following Detailed Description and the figures.

SUMMARY

Therefore, it is desired to obtain an oscillator having a structure, arrangement and wiring method to prevent such loss of signal output not only in the case of a single oscillator but also intensively in the case of oscillator elements provided in parallel.

In view of the above, embodiments of the present invention provide a micro-oscillator in which ground floating capacitance is reduced to control loss of signal output, a semiconductor device including the micro-oscillator and a communication apparatus including the micro-oscillator as a signal filter.

A micro-oscillator according to an embodiment includes an oscillation element formed on a substrate, which has a beam facing a lower electrode and electrostatically driven, and in which a DC bias feeder wire connected to the beam is formed to have a wire width narrower than the width of the beam.

Further, a micro-oscillator according to an embodiment includes a plurality of oscillator elements arrayed on a substrate, each of which has a beam facing a lower electrode and electrostatically driven, and in which beams of adjacent oscillator elements are connected through a DC bias feeder wire, and the DC bias feeder wire is formed to have a wire width narrower than the width of the beam.

A plurality of oscillator elements can be formed as an oscillator group in which the oscillator elements are arrayed regularly and are connected in parallel.

Further, a micro-oscillator according to an embodiment includes an oscillator group formed on a substrate, and in which a plurality of oscillator elements each having a beam facing a lower electrode and electrostatically driven are regularly arrayed, wherein beams of oscillator elements adjacent to each other in one direction are connected through a DC bias feeder wire and an interval between the DC bias feeder wires of the oscillator elements adjacent to each other in a direction intersecting the one direction is set larger than an interval between the beams.

An oscillator element excited to oscillate in a second-order harmonic oscillation mode can be used as the above-described oscillator element.

A semiconductor device according to an embodiment includes a micro-oscillator that has an oscillator element formed on a substrate, which has a beam facing a lower electrode and electrostatically driven, and in which a DC bias feeder wire connected to the beam is formed to have a wire width narrower than the width of the beam.

A communication apparatus according to an embodiment is a communication apparatus provided with a filter to limit a bandwidth of a transmission signal and/or reception signal, including the filter using a micro-oscillator that has an oscillator element formed on a substrate, which has a beam facing a lower electrode and electrostatically driven, and in which a DC bias feeder wire connected to the beam is formed to have a wire width narrower than the width of the beam.

According to an embodiment of the micro-oscillator, since the DC bias feeder wire connected to the beam to supply the DC bias voltage to the beam that becomes the oscillation portion is formed to have a width narrower than the width of the beam, the wiring area of the DC bias feeder wire becomes considerably small and so the ground capacitance between the substrate and the wire can be reduced. Hence, leakage of a signal to the substrate side can be controlled to a minimum, so that loss of signal output can be minimized.

According to an embodiment of the micro-oscillator, since the DC bias feed wire connected between the beams of adjacent oscillator elements is formed to have a wire width narrower than the width of the beam when a plurality of oscillator elements are arrayed as a oscillator group, the wiring area of the DC bias feeder wire of the whole oscillator group is considerably reduced and the ground capacitance between the substrate and the wire can be reduced. Hence, leakage of a signal to the substrate side can be controlled to a minimum, so that loss of signal output can be minimized.

An area of the oscillator group occupying a wafer can be reduced to the necessary minimum by regularly disposing the oscillator elements of the oscillator group.

According to an embodiment of the micro-oscillator, when viewing a layout, in the structure in which the oscillation elements are regularly disposed in one direction and in an intersecting direction (another direction), and the beams of adjacent oscillator elements in one direction are connected to each other through the DC bias feeder wire, since the interval between the DC bias feeder wires of the oscillator elements adjacent to each other in another direction is set larger than the interval between the beams, the wiring area of the DC bias feeder wire becomes small, and so leakage of a signal is controlled similarly to the above and loss of signal output can be minimized.

According to an embodiment of the semiconductor device, with the micro-oscillator according to the above-described embodiment being used as an oscillator constituting the semiconductor device, a semiconductor device having an excellent characteristic in which loss of signal output is minimized can be provided.

According to an embodiment of the communication apparatus since the filter made of the micro-oscillator according to an embodiment is used as a band-pass filter, loss of signal output is minimized to obtain an excellent characteristic, and so a communication apparatus having high reliability can be provided.

BRIEF DESCRIPTION OF THE FIGURES

FIGS. 6A and 6B are manufacturing process diagrams (1/3) showing a method for manufacturing a micro-oscillator according to an embodiment of the present invention;

FIGS. 8A and 8B are manufacturing process diagrams (3/3) showing a method for manufacturing a micro-oscillator according to an embodiment of the present invention;

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

DETAILED DESCRIPTION

Hereafter, embodiments will be explained with reference to the accompanied drawings.

In a micro-oscillator according to an embodiment, a DC bias feeder wire for feeding DC bias voltage to a parallel oscillator (i.e., a plurality of oscillator elements are arrayed and mutually connected in parallel) specifically, wiring to connect beams of adjacent oscillator elements is formed to have a width narrower than the width of the beam of the oscillator element.

Although ground capacitance of the whole micro-oscillator increases along with the increase in the wiring area of signal wiring, DC bias feeder wire and the like, the ground capacitance can be reduced when narrowing a wire width of the DC bias feeder wire, as in this embodiment. Since narrowing a width of a signal line results in increase of a wiring resistance in a signal path, it is difficult to reduce the width of the signal line. However, there is no negative effect on a signal strength due to reduction of the wire width of the DC bias feeder wire.

The oscillator elements can be arrayed regularly in this embodiment. In order to reduce the ground capacitance attributable to the DC bias feeder wire, the sum of distances between the oscillator elements should be short as a whole. It is possible that the oscillator elements are arranged at random, for example. However, in this case, there may occur various problems on process management when manufactured by arranging a large number of oscillator elements on a substrate. It may be extremely complicated to make a mask for lithography, and an unevenness of a polishing amount may occur when planarizing a wafer by chemical mechanical polishing (CMP). When practicability is taken into account, it is advantageous to dispose the oscillator elements regularly and as close as possible to reduce an area where a oscillator group is provided, with which an interval between the oscillator elements is shortened and the ground capacitance can be reduced. This is because the efficiency in using the wafer is enhanced and a micro-oscillator or semiconductor device including the micro-oscillator becomes less expensive.

Figure 4:
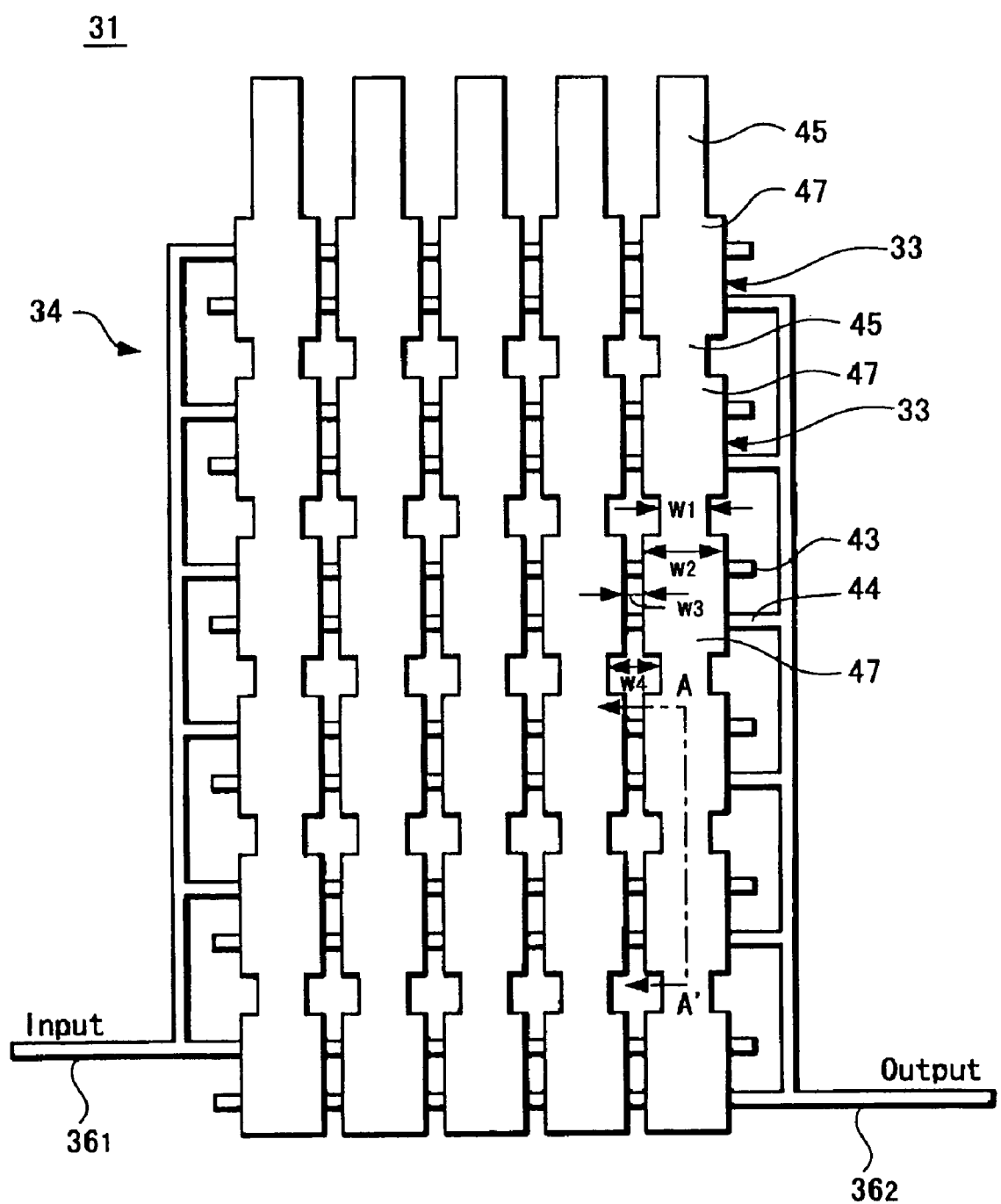
FIG. 4 is a schematic constitutional diagram showing a micro-oscillator according to an embodiment of the present invention.

FIG. 4 conceptually shows a micro-oscillator according to an embodiment. An oscillator element used in this embodiment is a micro-scale or nano-scale element. In this embodiment, an electrostatic drive oscillator group of mechanical resonance frequency 100 MHz, which includes on the substrate an input electrode and output electrode of lower electrodes and a oscillating beam supported at both ends, is used as an example.

As shown in FIG. 4, a micro-oscillator 31 according to this embodiment includes an oscillator group 34 made of a plurality of electrostatic drive oscillator elements 33 disposed on a substrate, specifically, on a substrate in which an insulation film is formed on the surface of a high resistance silicon substrate. It is desirable that a plurality of oscillator elements 33 be arrayed regularly in the oscillator group 34. In this embodiment, the oscillator elements 33 in the oscillator group 34 are arrayed lengthways and width ways in a lattice form with regularity. Each of oscillator elements 33 includes: an input electrode 43 and output electrode 44 of lower electrodes, a wiring layer 45 to be a DC bias feeder wire and a beam 47 whose both ends are supported by the wiring layer 45 to be an oscillating electrode, as described later on (described in detail using FIG. 5).

In the oscillator elements 33 of each column, adjacent beams 47 in the lengthwise direction are connected through the wiring layer 45 in common. Further, the oscillator elements 33 of each row are formed such that the input electrode 43 and output electrode 44 are formed in common to all the oscillator elements 33 arrayed in the widthwise direction. Each of oscillator elements 33 is connected in parallel by connecting the input electrode 43 to a signal wire 361 formed on the substrate in common and by connecting the output electrode 44 to a signal wire 362 formed on the substrate in common.

Further, in the micro-oscillator of this embodiment, a wiring layer to supply DC bias voltage, specifically, the DC bias feeder wire 45 is connected to the beam 47 of the oscillator element 33 and the DC bias feeder wire 45 that connects adjacent oscillator elements 33 in the lengthwise direction is formed to have a wire width W1 narrower than a beam width W2 of the beam 47. When viewing the whole layout pattern, the micro-oscillator is formed such that an interval W3 between the beams 47 of the adjacent oscillator elements 33 in the widthwise direction becomes narrower than an interval W4 between the DC bias feeder wires 45 of the same oscillator elements 33.

Figure 5:
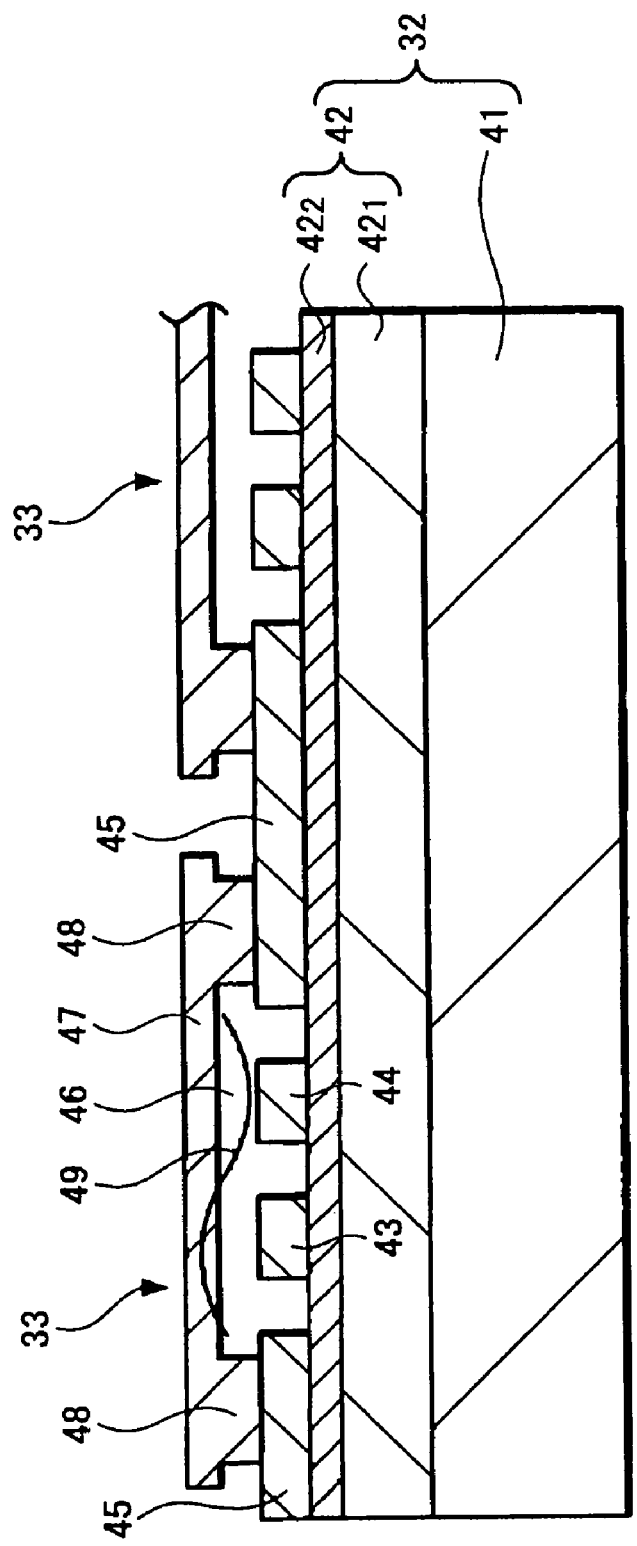
FIG. 5 is a cross-sectional diagram on an A-A' line of FIG. 4.

FIG. 5 shows a cross-sectional structure on an A-A' line of FIG. 4. In this embodiment, each oscillator element 33 is driven in a second-order harmonic oscillation mode.

As shown in FIG. 5, similarly to the one described above, each oscillator element 33 includes on a substrate 32, in which an insulation film 42 such as a silicon oxide/nitride film, for example, is formed on a surface of a silicon substrate 41, the input electrode 43 and output electrode 44 to be the lower electrodes, wiring layers on both sides with the input and output electrodes 43 and 44 in between, that is, the DC bias feeder wire 45, and the beam 47 to be the oscillating electrode disposed to face the input and output electrodes 43 and 44 across a space 46. The beam 47 is supported at both ends by anchor portions (support portions) 48 electrically and mechanically connected to the DC bias feeder wire 45. This beam is formed to be what is called a both-ends supported beam structure. Further, the width of the beam 47 and that of the DC bias feeder wire 45 are set to have the relation described in FIG. 4.

Similarly to the one described above, when DC bias voltage is applied to the beam 47 through the DC bias feeder wire 45 and a frequency signal is input to the input electrode 43 in this oscillator element 33, the beam 47 resonates and a signal of an objective frequency is output to the output electrode 44. As shown in FIG. 5, the oscillator element 33 resonates in a second-order harmonic oscillation mode 49.

Next, a method of manufacturing a micro-oscillator of this embodiment is explained with reference to FIGS. 6 through 8. Those figures show a cross-sectional structure on the A-A' line of FIG. 4. Specifications applied to the process are equivalent to those used in a typical CMOS manufacturing process.

First, as shown in FIG. 6A, an insulation film 42 is formed on the upper surface of a high resistance silicon substrate 41. In this embodiment, a composite film 42 made of a silicon oxide thin film (HDP film: High Density Plasma oxide film) $42_1$ and silicon nitride film $42_2$ is formed in the thickness of approximately 200 nm, for example. Subsequently, a conductive film 53 is formed on the insulation film 42. In this embodiment, a conductive polycrystalline silicon thin film (PDAS film: Phosphorus Doped Amorphous Silicon) 53 is formed to have a required thickness of approximately 380 nm, for example. Next, patterning is performed on the polycrystalline silicon 53 using a resist mask and etching (dry etching in this embodiment), and the input electrode 43 and output electrode 44 to be the lower electrodes made of the polycrystalline silicon thin film 53 and the wiring layer 45 to fix the beam are formed. The wiring layer 45 becomes the DC bias feeder wire to supply the DC bias voltage to the beam. When the wiring layer 45 is formed, the patterning is performed such that the width W1 thereof becomes narrower than the width W2 of the beam 47 formed later on.

Next, as shown in FIG. 6B, the formed input electrode 43, output electrode 44, and wiring layer 45 are buried again with a sacrifice layer 54 and the sacrifice layer is planarized to expose the surfaces of the lower electrodes. In this embodiment, an insulation film 54 made of, for example, silicon oxide (HDP film) is used as the sacrifice layer 54 again to bury the electrodes and wiring layer, and is planarized to expose the surfaces of the input electrode 43, output electrode 44, and wiring layer 45 by the chemical mechanical polishing method (CMP).

Figure 7A:
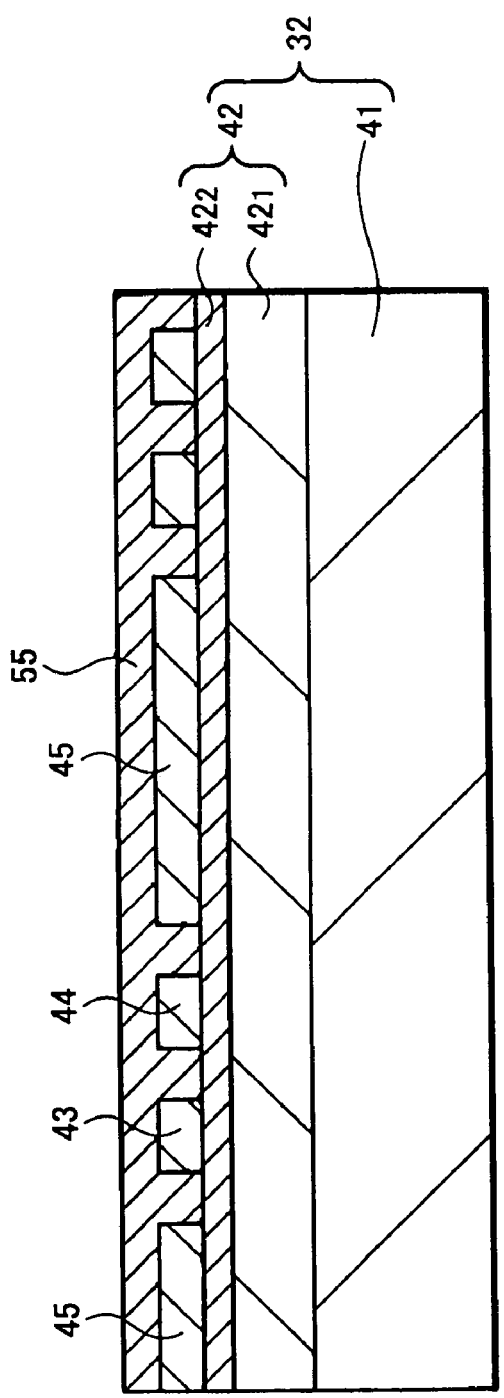
FIGS. 7A and 7B are manufacturing process diagrams (2/3) showing a method for manufacturing a micro-oscillator according to an embodiment of the present invention.

Next, as shown in FIG. 7A, on the planarized surface a sacrifice layer 55 is formed, having the thickness corresponding to an interval between the input and output electrodes 43, 44 and a beam formed later on. In this embodiment, a silicon oxide thin film (LP-TEOS: Low Pressure Tetra-Ethoxy-Silane), for example, that is an insulation film is formed as the sacrifice layer 55.

Figure 7B:
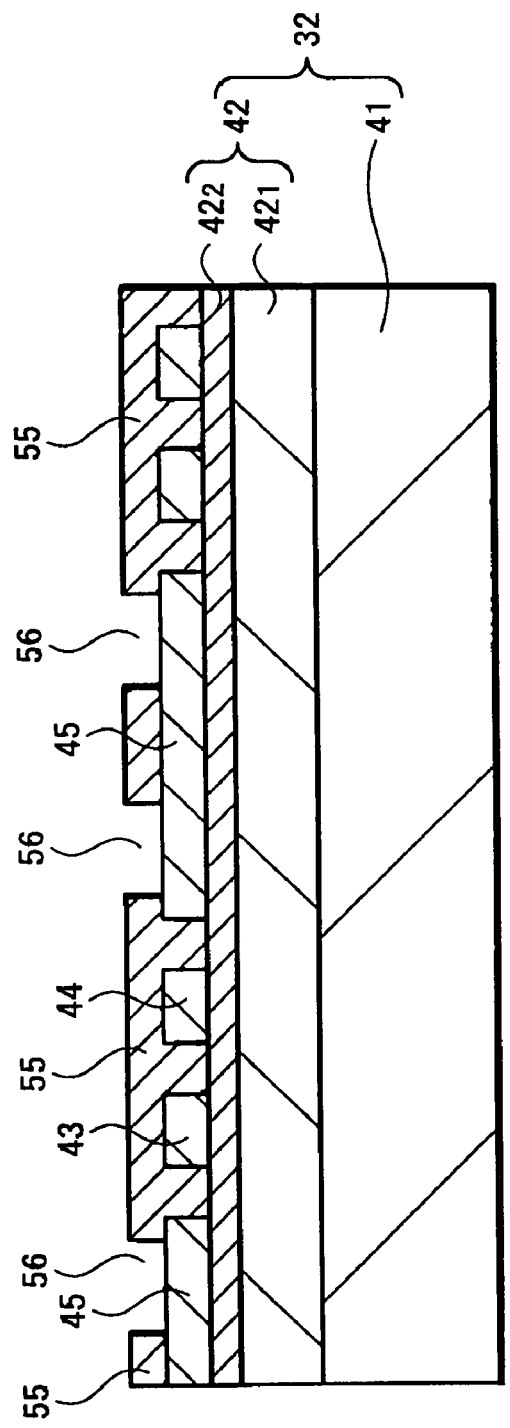

Next, as shown in FIG. 7B, an opening 56 that reaches the wiring layer 45 is formed in the sacrifice layer 55 at a position corresponding to the wiring layer 45.

Next, as shown in FIG. 8A, after a polycrystalline silicon film (PDAS film) 57 is formed to have a required film thickness, the beam 47 made of the polycrystalline silicon film 57 is formed by pattering the film into a beam shape. Patterning can be performed by polycrystalline dry etching.

Next, an Al—Si thin film, for example, which becomes a wiring and pad is formed on the insulation film 42 of the other portion on the substrate, and a resist mask having a pattern corresponding to the wiring and pad is formed on the Al—Si thin film. Then, etching is performed to selectively remove an unnecessary Al—Si thin film and the sacrifice layers 54, 55 by using a solution of hydrogen fluoride (BHF), for example. As a result, as shown in FIG. BE, the space 46 having a required interval, that is, an interval of approximately 50 nm for example, is formed between the input and output electrodes 43, 44 and the beam 47, and so the intended micro-oscillator 31 is obtained.

According to the micro-oscillator 31 (FIG. 4) of this embodiment, since the DC bias feeder wire 45 connected to the oscillator group 34 and DC bias feeder wire 45 connecting the oscillator elements 33 in the oscillator group 34 are formed to have the wire width W1 narrower than the width W2 of the beam 47, wiring area of the DC bias feeder wire 45 in the oscillator group 34 becomes small to reduce the ground capacitance of the whole system of the oscillator group 34. Accordingly, leakage of a signal to the substrate side through the ground capacitance connected to the signal line 362 can be controlled to the minimum and so loss of signal output can be minimized.

When the micro-oscillator 31 of this embodiment is used as an element, a signal processing device having an excellent characteristic with low power consumption can be obtained. This is because the power consumption in an amplifier at a later stage can be controlled low correspondingly to the reduced amount with respect to a signal attenuation in the oscillator element 33.

In addition, since the area of the oscillator group 34 occupying the wafer can be limited to the necessary minimum with the oscillator elements 33 being disposed regularly, a performance can be improved and costs can be reduced with respect to the signal processing device.

Figure 9A:
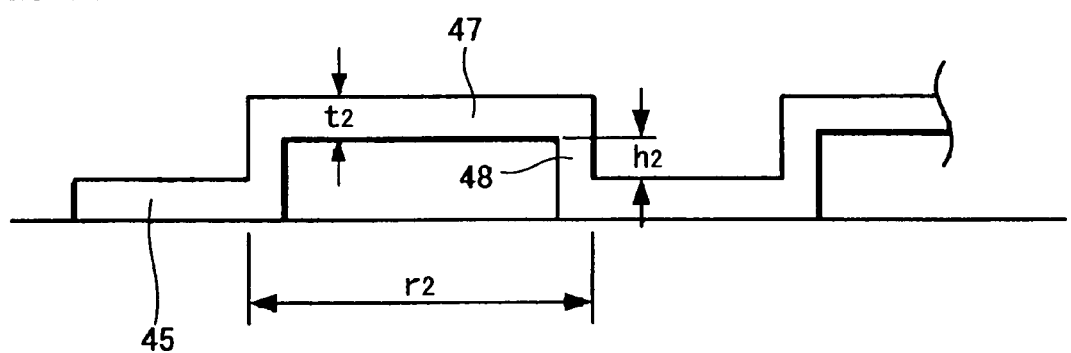
FIGS. 9A and 9B are model diagrams for explaining a wiring width of a DC bias feeder wire according to an embodiment of the present invention.
Figure 9B:
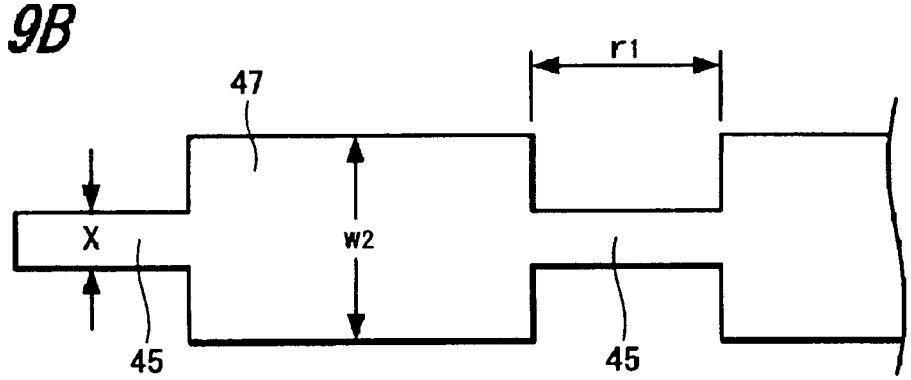

Next, range of the wire width of the DC bias feeder wire 45 according to this embodiment is explained by using a model in FIGS. 9A and 9B.

A limit on a resistance value is determined depending on the extent of decrease in the resonance frequency of the oscillator element 33 caused by a drop in the DC bias voltage, specifically, depending on the DC bias feeder wire 45 (the number of oscillator elements 33 connected in series and the interval between the oscillator elements). When a resonance frequency of oscillator elements connected in parallel varies, effectiveness of the impedance reduction obtained therefrom is cancelled because of decrease in a resonance peak value of the parallelized oscillator group and an expansion in resonance bandwidth. A suitable value is determined in consideration of a bandwidth and loss in the band required for an assumed filter.

Here, the allowable decrease of the resonance frequency is empirically assumed to be 0.1 MHz. A changed amount of the DC bias voltage corresponding to the changed amount 0.1 MHz of the resonance frequency can be obtained from a measured value of a bias voltage dependency of the resonance frequency when applying the DC bias voltage of approximately 80% of a pull-in voltage between the beam and the lower electrodes, which is approximately 0.5 V. It should be noted that the pull-in voltage is DC voltage when the beam bends and contacts with the lower electrode at the time of applying the DC bias voltage to the beam. Narrowing the width of the beam of the oscillator element causes a negative influence on homogeneity of the resonance characteristic as described above. A design in which the wire width of the DC bias feeder wire between the oscillator elements is made relatively narrow in comparison to the beam width of the oscillator element becomes efficient.

FIGS. 9A and 9B show a model in which the wire width of the DC bias feeder wire is estimated when parallelism is assumed to be N=300 to 900 and the number of oscillator elements connected in series is 30. In the case where a doped polycrystalline silicon thin film (resistivity is $9.3 \times 10^{-4}$ $\Omega \cdot$cm) is used as a material for wiring of the DC bias feeder wire and the beam, a critical wiring width becomes $X=3 \times 10^{-6}$ μm and the DC bias feeder wire can be manufactured with the minimum wire width allowed in a CMOS production process.

In FIGS. 9A and 9B, the critical wiring width X of the DC bias feeder wire 45 is calculated, where a film thickness t2, length r2 and width w2 of the beam 47 are t2=1 μm, r2=10 μm and w2=7 ρm respectively, a height of the anchor portion

48 is h2=1 μm, and a length between the adjacent beams 47, that is, a length of the DC bias feeder wire 45 is r1=5 μm.

$$0.5V=1nA \times 30 \times 9 \times 10^{-4} \Omega \cdot cm \times \{12 \times 10^{-4}/(1 \times 10^{-4} \times 7 \times 10^{-4}) + 5 \times 10^{-4}/(1 \times 10^{-4} \times X \times 10^{-4})\} cm^{-4}.$$

Hence, the critical wiring width becomes $X=3 \times 10^{-6}$ μm.

Next, an evaluation of the ground capacitance of the micro-oscillator according to this embodiment is explained by using a simulation.

First, a mechanical characteristic of a beam structure is obtained by using a finite element method. For this purpose, "CoventorWare (Analyzer)" manufactured by Coventor, Inc. can be used. The shape and material constants (specific gravity, Young's modulus, stress) of the beam are input to obtain resonance frequency fO, effective mass m and pull-in voltage Vp of the beam.

Next, a mechanical characteristic of an oscillator of an electrostatic drive method can be converted into an electrically equivalent circuit constant by using an analytical method obtained by Frank D. Bannon III et al. (Frank D. Bannon III, John R. Clark, Clark T.-C. Nguyen, "High-Q HF Microelectromechanical Filters", IEEE Journal of Solid-state Circuits, Vol. 35, No. 4, April 2000, pp. 512-526). The resonance frequency fO, effective mass m, and appropriate drive voltage (estimated from pull-in voltage Vp) of the beam, which are obtained in the calculation of finite element method, physical dimensions of the electrostatic drive oscillator (an interval between the beam and the lower electrodes, and area of the electrode) and Q-value (empirical value) are used as input parameters.

Through this procedure, the electrically equivalent circuit constant of one oscillator without influence of the ground capacitance generated with wiring and the like can be obtained. With the thus obtained circuit constant being multiplied by a fixed number in accordance with the parallelism of the oscillator, an ideal circuit constant of the parallelized oscillator can be obtained.

An influence of ground capacitance on a characteristic of a filter made of the parallelized beam-type oscillator of the electrostatic drive method can be evaluated by adding the ground capacitance and assumed impedance of a circuit in later stages to the ideal filter circuit obtained using the equivalent circuit constant of the oscillator calculated as described above and by obtaining an S parameter of a circuit based on a value of the ground capacitance as a variable.

Figure 10:
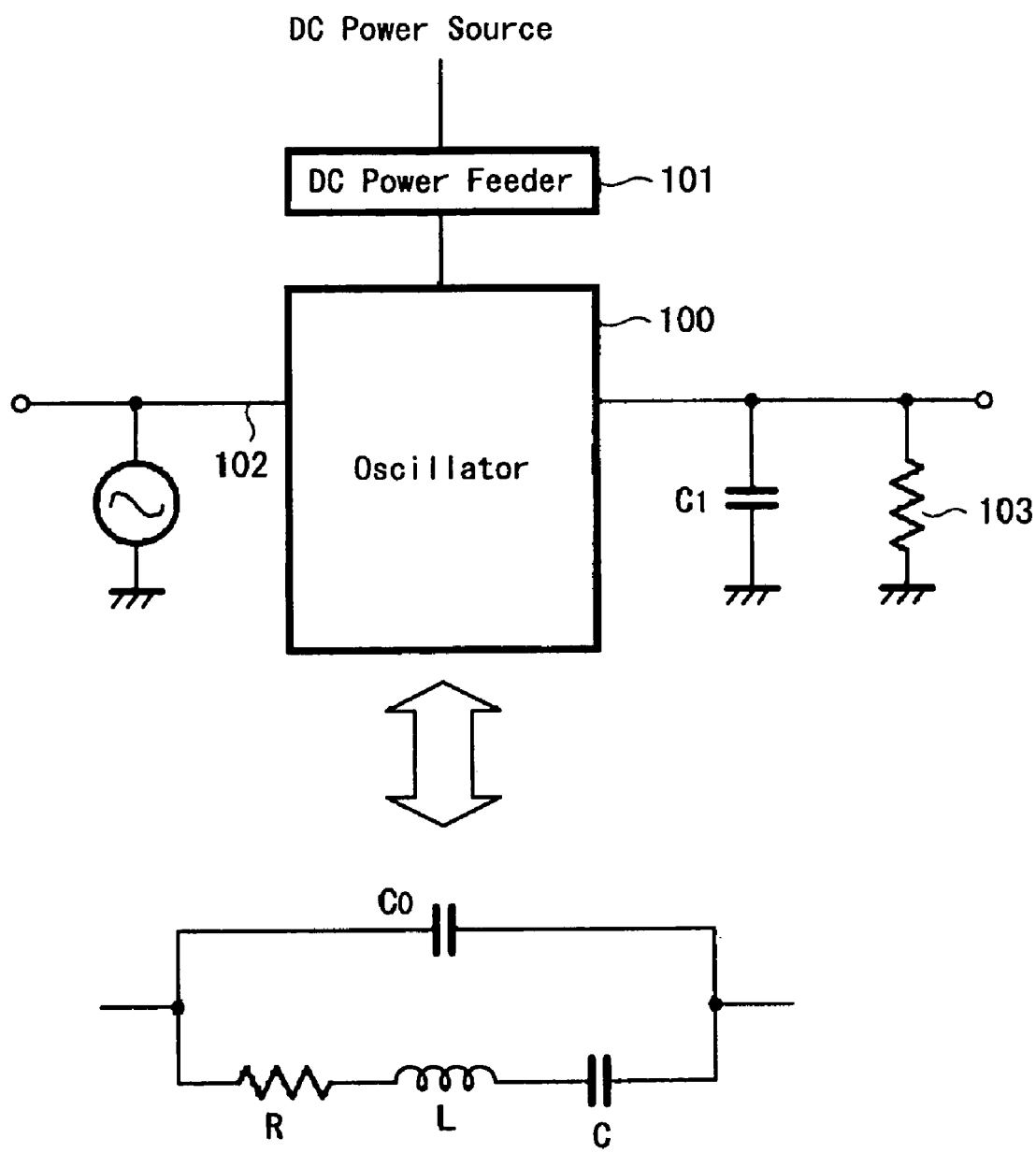
FIG. 10 is an equivalent circuit diagram of a micro-oscillator according to simulation of a ground capacitance evaluation.
Figure 11:
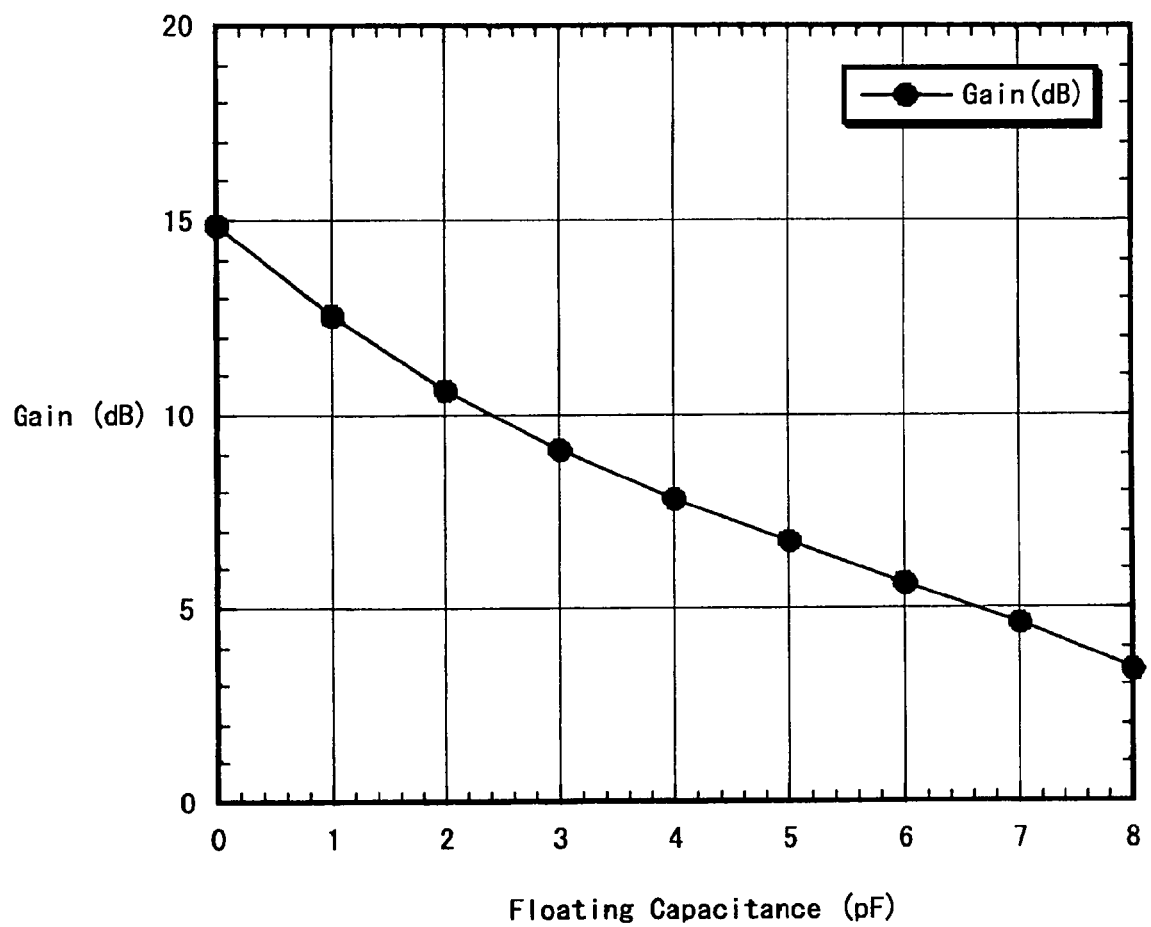
FIG. 11 is a graph showing a ground capacitance dependency of an amplifier gain according to simulation of a ground capacitance evaluation.

FIGS. 10 and 11 show the equivalent circuit of the oscillator and the calculation result (ground capacitance dependency of amplifier gain) when the parallelism is N=200, respectively. In this estimation, a buffer amplifier is provided in the later stage of filter for impedance matching. In the equivalent circuit of FIG. 10, DC bias voltage is supplied from a DC power source to an oscillator (oscillator group) 100 and a beam of the oscillator 100 through a DC feeder wire 101. A frequency signal S is supplied to an input terminal of a signal wire 102. Ground capacitance C, is connected to an output side of the signal wire 102, and further a subsequent amplifier 103 is connected thereto. The equivalent circuit of the oscillator 100 is expressed with a form in which a series circuit of resistance R, inductance L and capacitance C is connected in parallel with capacitance $C_0$. In this simulation, the parallelism is N=200, $C_0=3.0 \times 10^{-3}$, $R=3.123 \times 10^2$, $L=7.766 \times 10^{-5}$, $C=8.84 \times 10^{-15}$, and the resistance of the subsequent amplifier 103 is $R=1 \times 10^3$. FIG. 11 shows only an appearance and is not a case where a power amplification is performed. It is shown that an impedance conversion may not efficiently be performed when the ground capacitance increases.

It is recognized from the obtained result that an reduction of the ground capacitance is imperative in order to improve an equivalent characteristic. Approximately, the ground capacitance has a positive correlation to area occupied by a device on a substrate, and it is efficient to make the device small, however, on the other hand, since a beam-type oscillator of an electrostatic drive method typically has high impedance and therefore reduction in electrode area, beam size and signal line width causes an increase in impedance, the effectiveness of decrease in impedance obtained from the parallelization is offset to make the characteristic of the device deteriorated. On the other hand, electric current that flows in the DC bias feeder wire is approximately 1 nA, and influence is scarce even if the DC bias feeder wire is narrowed and the wire line resistance increases. Therefore, in order to improve the characteristic of the device, it is advantageous to narrow the wire width of the DC bias feeder wire to thereby reduce the ground capacitance.

In the micro-oscillator of the above-described embodiment, the present invention is applied to a case where a plurality of oscillator elements are parallelized and provided as the oscillator group, however, the present invention can also be applied to an oscillator of a single unit and leakage of a signal power to a substrate can be controlled to the minimum.

Figure 1:
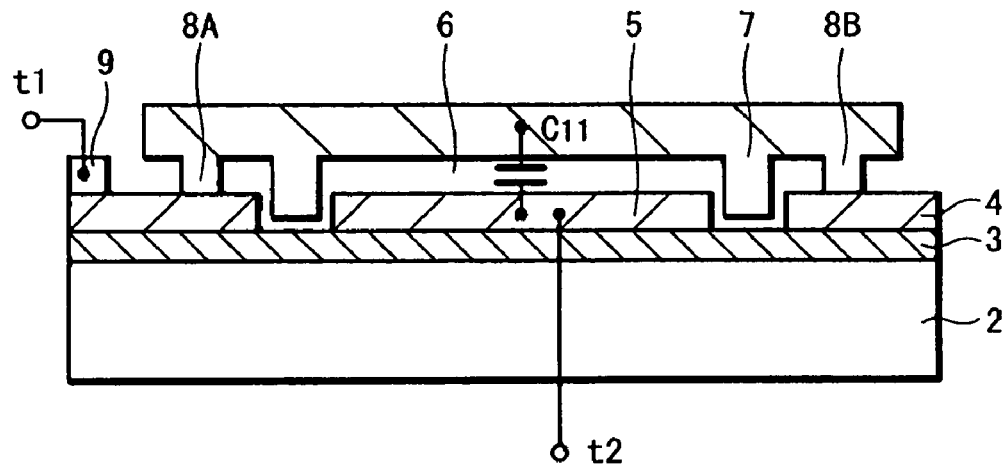
FIG. 1 is a constitutional diagram showing an electrostatic drive oscillator of related art.
Figure 2:
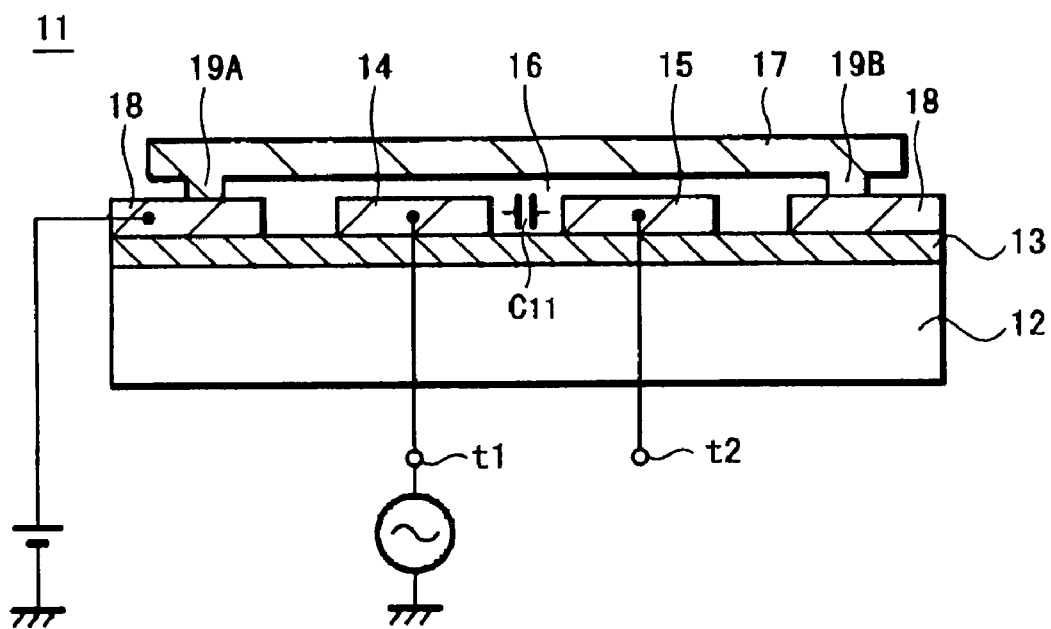
FIG. 2 is a constitutional diagram showing an electrostatic drive oscillator according to related art.
Figure 3:
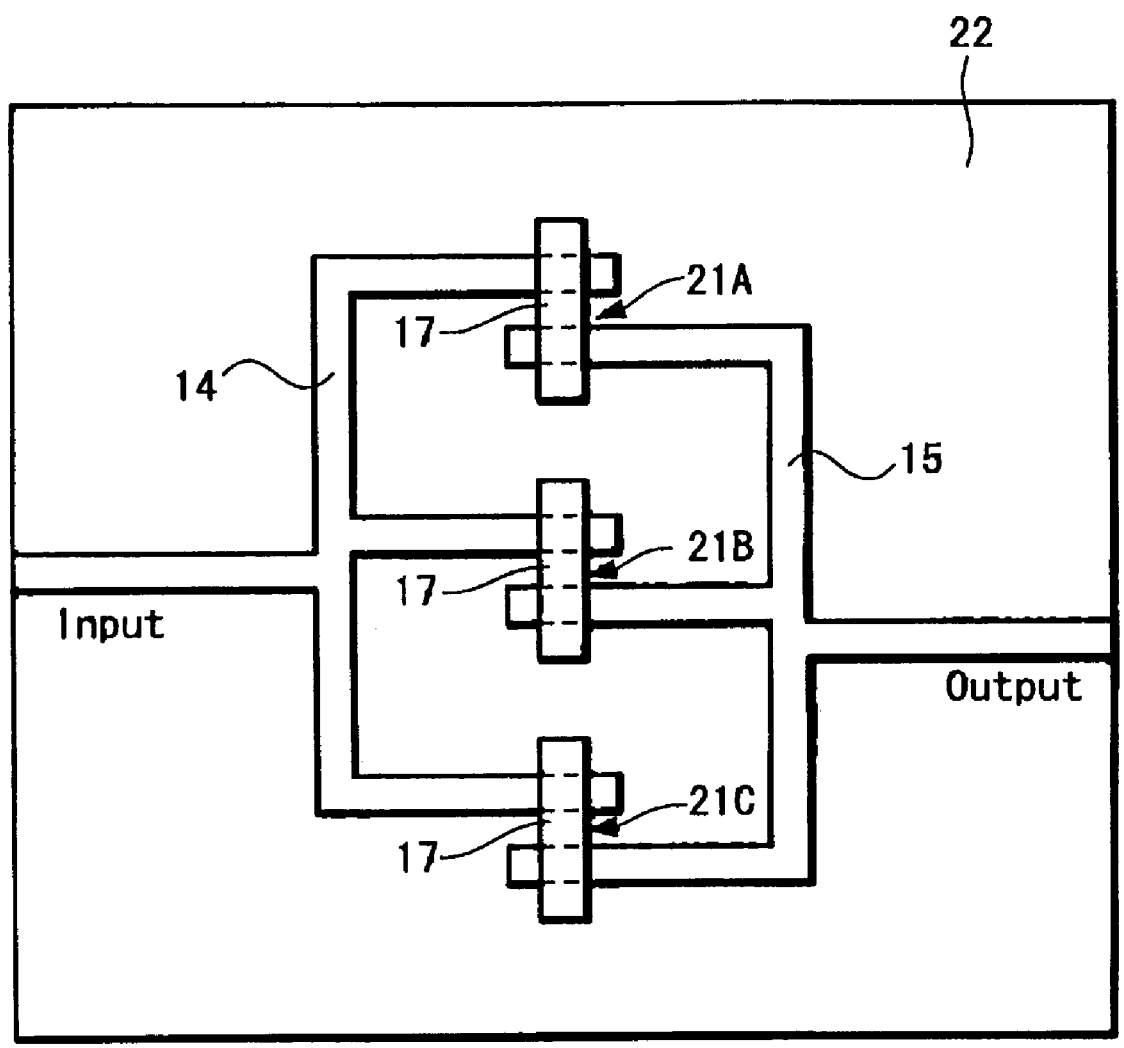
FIG. 3 is a constitutional diagram showing an example of a micro-oscillator in which a plurality of oscillator elements are disposed in parallel.

Further, the oscillator element having the input electrode and output electrode as the lower electrodes is employed in the above-described embodiment, however, the present invention can also be applied to an oscillator element shown in FIG. 1 having a structure in which the beam is used for the input electrode and the lower electrode is used for output.

Furthermore, although the oscillator element of the second-order harmonic oscillation mode is used in the above-described embodiment, an oscillator element of another oscillation mode can also be used.

In another embodiment, the above-described micro-oscillator is used to provide a signal filter, mixer, resonator and a semiconductor device such as a SiP (System in Package) device module and SoC (System on Chip) device module, including those filter, mixer and resonator.

According to the semiconductor device of this embodiment, since the above-described micro-oscillator with a small loss of a signal output is used for an oscillator constituting an element of the semiconductor device, a semiconductor device having an excellent characteristic and high reliability can be obtained.

The micro-oscillator made of the electrostatic drive oscillator group of the above-described embodiment can be used as a band-pass signal filter such as a high frequency (RF) filter and intermediate frequency (IF) filter.

According to the embodiment of the present invention, a communication apparatus that uses an electromagnetic wave to perform communication, such as a mobile phone unit, a wireless LAN device, a wireless transceiver, a television tuner and a radio tuner, including the filter made of the micro-oscillator of the above-described embodiment can be obtained.

Figure 12:
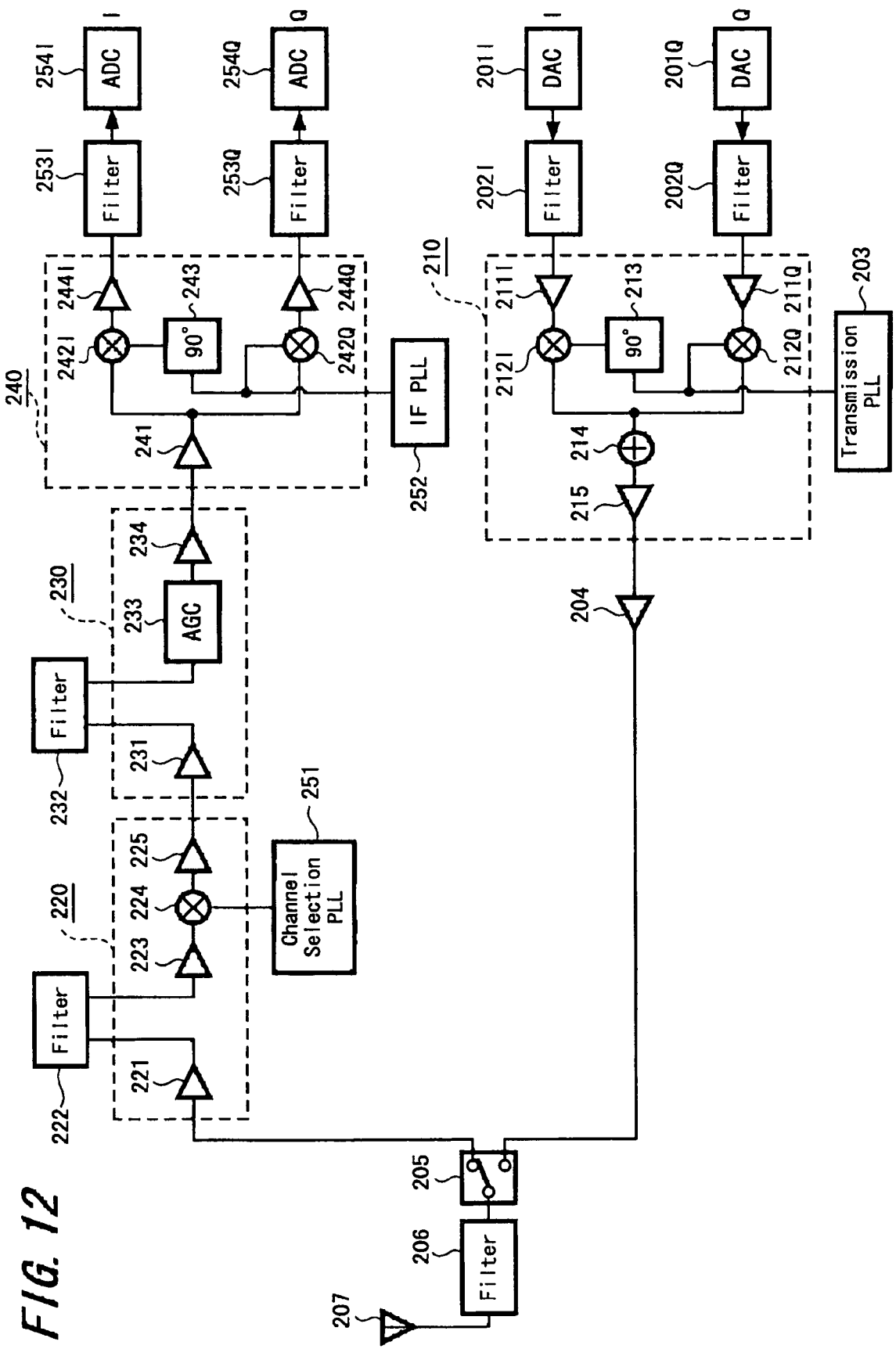
FIG. 12 is a constitutional diagram showing a communication apparatus according to an embodiment of the present invention.

Next, an example of a configuration of a communication apparatus, to which the filter of this embodiment is applied, is explained by referring to FIG. 12.

First, an explanation is made regarding a configuration of a transmission system in which transmission data of I channel and transmission data of Q channel are respectively supplied to digital/analogue converters (DAC) 201I and 201Q to be converted into analogue signals. The converted signal of each channel is supplied to band-pass filters 202I and 202Q, and outputs of the band-pass filters 202I and 202Q are supplied to a modulator 210 after a signal component other than that in a band of a transmission signal is removed.

In the modulator 210, a signal of each channel is supplied to mixers 212I and 212Q through buffer amplifiers 211I and 211Q, and is mixed with a frequency signal corresponding to a transmission frequency supplied from a transmission PLL (phase-locked loop) circuit 203 and modulated to obtain a transmission signal of one system after adding the both mixed signals in an adder 214. In this case, a signal phase is shifted by 90° in a phase shifter 213 as to the frequency signal supplied to the mixer 212I such that the signal of I channel and the signal of Q channel are orthogonally modulated. An output of the adder 214 is supplied to a power amplifier 204 through a buffer amplifier 215, and is amplified to be predetermined transmission power. The signal amplified in the power amplifier 204 is supplied to an antenna 207 through a transmission-reception switching unit 205 and high frequency filter 206, and is transmitted wirelessly from the antenna 207. The high frequency filter 206 is a band-pass filter that removes a signal component other than that in the frequency band to transmit and receive in this communication apparatus.

As a configuration of a reception system, a signal received by the antenna 207 is supplied to a high frequency unit 220 through the high frequency filter 206 and transmission-reception switching unit 205. In the high frequency unit 220, the received signal is amplified in a low noise amplifier (LNA) 221 and is thereafter supplied to a band-pass filter 222 to remove a signal component other than that in a reception frequency band, and the signal after the removal is supplied to a mixer 224 through a buffer amplifier 223. Further, a frequency signal supplied from a channel selection PLL circuit 251 is mixed to make a signal of a predetermined transmission channel into an intermediate frequency signal, and the intermediate frequency signal is supplied to an intermediate frequency circuit 230 through a buffer amplifier 225.

In the intermediate frequency circuit 230, the supplied intermediate frequency signal is supplied to a band-pass filter 232 through a buffer amplifier 231 to remove a signal component other than that in the band of the intermediate frequency signal, and the signal after the removal is supplied to an automatic gain control circuit (AGC circuit) 233 to be made into a signal of an approximately constant gain. The intermediate frequency signal whose gain is adjusted in the automatic gain control circuit 233 is supplied to a demodulator 240 through a buffer amplifier 234.

In the demodulator 240, the supplied intermediate frequency signal is supplied to mixers 242I and 242Q through a buffer amplifier 241 to be mixed with a frequency signal supplied from an intermediate frequency PLL circuit 252, and the received signal component of I channel and signal component of Q channel are demodulated. In this case, a frequency signal whose signal phase is shifted by 90° in a phase shifter 243 is supplied to the mixer 242I for I signal to demodulate the orthogonally modulated signal component of I channel.

The demodulated signals of I channel and Q channel are respectively supplied to band-pass filters 253I and 253Q through buffer amplifiers 244I and 244Q to remove a signal component other than that of the signals of I channel and Q channel, and the signals after the removal are supplied to analogue/digital converters (ADC) 254I and 254Q to be sampled and converted into digital data, and so reception data of I channel and reception data of Q channel are obtained.

With respect to the configuration explained above, band-limiting can be performed by applying the filter having the configuration of the above-described embodiment to part of or to all of the band-pass filters 202I, 202Q, 206, 222, 232, 253I and 253Q. Although each filter is configured as a band-pass filter in the example of FIG. 12, the filter is configured as a low pass filter that passes only a frequency band lower than a predetermined frequency and as a high pass filter that passes only a frequency band higher than a predetermined frequency, to which the filter having the above-described configuration of the embodiment is applied. In addition, the example of FIG. 12 is the communication apparatus that performs wireless transmission and wireless reception, however, the filter according to the embodiment can be applied to a filter included in a communication apparatus that performs transmission and reception through a wired transmission path, and furthermore can be applied to a filter included in a communication apparatus that performs only transmission processing and in a communication apparatus that performs only reception processing.

According to an embodiment of the communication apparatus, since the filter including the micro-oscillator as a band-pass filter is used to obtain excellent characteristics in which loss of signal output is reduced, a highly reliable communication apparatus can be provided.

It should be understood by those skilled in the art that various modifications, combinations, sub-combinations and alterations may occur depending on design requirements and other factors insofar as they are within the scope of the appended claims or the equivalents thereof.

The invention is claimed is:

1. A micro resonator, comprising:
a vibrating element formed on a substrate, and including a beam facing a lower electrode, wherein said vibrating element is electrostatically driven, wherein a DC bias feeder wire connected to said beam is formed to have a wire width narrower than the width of said beam.

2. A micro resonator, comprising:
a plurality of vibrating elements arrayed on a substrate, each of said elements having a beam facing a lower electrode and are electrostatically driven, wherein beams of adjacent vibrating elements are connected through a DC bias feeder wire, and wherein the DC bias feeder wire is formed to have a wire width narrower than the width of said beams.

3. A micro resonator according to claim 2, wherein said plurality of vibrating elements regularly arrayed are connected in parallel to be formed as a vibrating group.

4. A micro resonator, comprising:
a vibrating group formed on a substrate, in which a plurality of vibrating elements each having a beam facing a lower electrode and which are electrostatically driven are regularly arrayed, wherein beams of said vibrating elements adjacent to each other in one direction are connected through a DC bias feeder wire, and an interval between the DC bias feeder wires of said vibrating elements adjacent to each other in a direction intersecting said one direction is set larger than an interval between the beams.

5. A micro resonator according to claim 1, wherein said vibrating element is excited and oscillated in a second-order harmonic oscillation mode.

6. A micro resonator according to claim 2, wherein said vibrating element is excited and oscillated in a second-order harmonic oscillation mode.

7. A micro resonator according to claim 3, wherein said vibrating element is excited and oscillated in a second-order harmonic oscillation mode.

8. A micro resonator according to claim 4, wherein said vibrating element is excited and oscillated in a second-order harmonic oscillation mode.

9. A semiconductor device, comprising:
   a micro resonator including a vibrating element formed on a substrate, which has a beam facing a lower electrode and which is electrostatically driven, wherein a DC bias feeder wire connected to said beam is formed to have a wire width narrower than a width of said beam.

10. A communication apparatus including a filter to limit a bandwidth of a transmission signal and/or reception signal, said communication apparatus comprising:
   a filter using a micro resonator that includes a vibrating element formed on a substrate, which has a beam facing a lower electrode and which is electrostatically driven, wherein a DC bias feeder wire connected to said beam is formed to have a wire width narrower than a width of said beam.

* * * * *